United States Patent
Tsung-Wen (12)

(10) Patent No.: US 6,225,139 B1
(45) Date of Patent: May 1, 2001

(54) MANUFACTURING METHOD OF AN LED OF A TYPE OF ROUND CONCAVE CUP WITH A FLAT BOTTOM

(76) Inventor: Chan Tsung-Wen, No. 19, Lane. 292, Sec.1, Datung Rd., Shijr City (TW)

( * ) Notice: Subject to any disclaimer, the term of this patent is extended or adjusted under 35 U.S.C. 154(b) by 0 days.

(21) Appl. No.: 09/489,829

(22) Filed: Jan. 24, 2000

(51) Int. Cl.$^7$ .................................................. H01L 21/00
(52) U.S. Cl. .................................. 438/26; 438/15; 73/75
(58) Field of Search ................................ 438/14, 15, 25, 438/26, 40, 43; 73/29, 73, 75, 335

(56) References Cited

U.S. PATENT DOCUMENTS 5,809,826 * 9/1998 Baker, Jr. .................................. 73/75

* cited by examiner

*Primary Examiner*—David Neims
*Assistant Examiner*—Phuc T. Dang
(74) *Attorney, Agent, or Firm*—Bacon & Thomas, PLLC

(57) ABSTRACT

A manufacturing method of an LED of a type of round concave cup with a flat bottom comprises two manufacturing steps. At first stage of concave cup printer circuit board, a printed circuit board is placed in a CNC computer driller, and a special miller cutting is used to drill a concave cup with a round flat bottom at the speed of 12000 to 25000 rps (the depth of the cup must be set). After drilling process is complete, a sand ejector serves to polish the interior of the concave cup. Then, plating with copper ions (which is similar to the penetrating process of guide holes in a general printed circuit board), after plating nickel step and plating metal step are completed, the first stage is finished. In the second stage, a manufacturing method of concave cup type LED is performed. The concave cup type LED in the first stage is processed through the steps of point gluing, fixing chip, baking, bonding, quality controlling, filling glue, and baking again. Then a multiple usage concave cup type LED is fabricated.

13 Claims, 6 Drawing Sheets

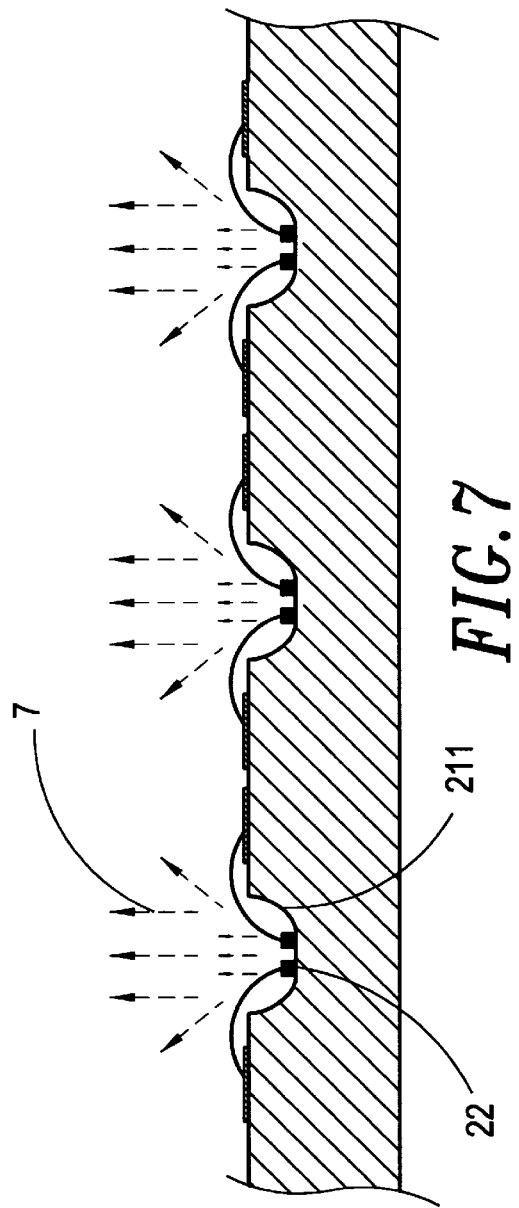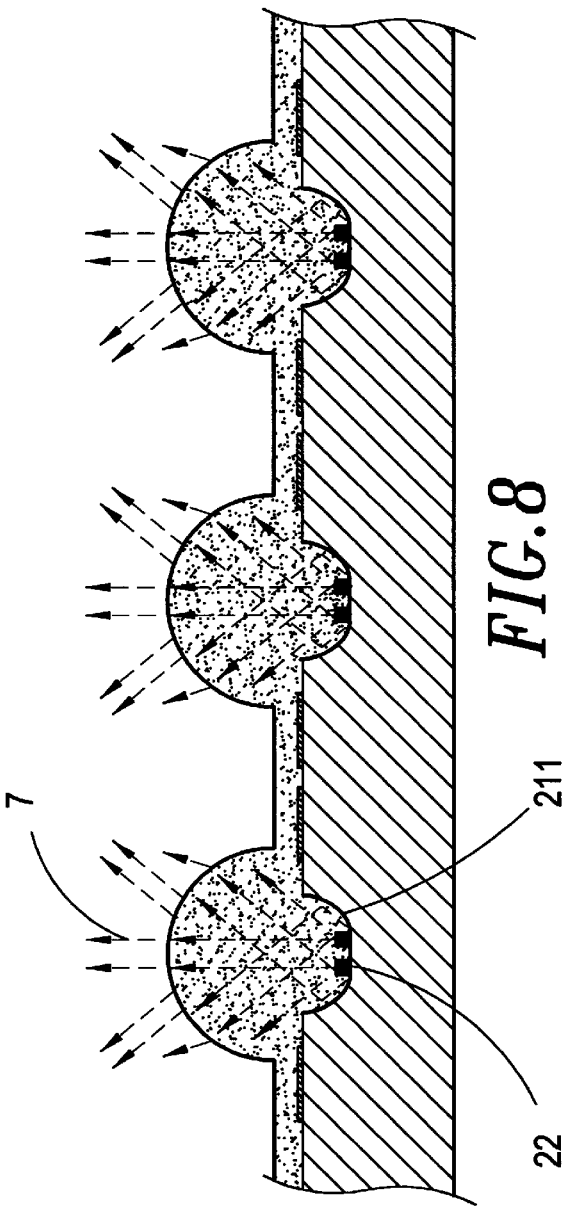

MANUFACTURING METHOD OF AN LED OF A TYPE OF ROUND CONCAVE CUP WITH A FLAT BOTTOM

BACKGROUND OF THE INVENTION

1. Field of the Invention

The present invention relates to a manufacturing method of an LED of a type of round concave cup with a flat bottom, which can be used in surface mounting light emitting diodes, point matrix light emitting diodes, seven sectional displaying light emitting diodes, LCD back light products, lights inner a car, braking lights, traffic lights, outdoor broadcast boards, etc.

2. Description of the Prior Art

With reference to FIG. 1, the schematic view of a prior art LED is illustrated. It is appreciated from the figure that a prior art LED 1 is connected to an aluminum supporter 11 by a conductive wire. The aluminum supporter 11 passes through a printed circuit board 12 and is welded to another surface of the printed circuit board 12 by tin 13. In the LED having such a structure, in the manufacturing process of the aluminum supporter 11, a shift from the center axis will cause a uniform illumination. This critical defect in this structure is that heat can not be dissipated easily. Since the operating temperature has a critical relation to the illumination. Therefore, the function of heat dissipation is used as an indication for determining the performance of an LED.

The way for calculating an LED operating temperature is:
1. Setting the speed of an electronic rectangular pulse wave to be 10 ms.
2. Setting the conducting of a predetermined current to be 20 mA for lighting through 20 minutes continuously;
3. For example, assume saturation voltage of an LED is 20 mA, the LED is lighted continuously for 30 minutes, then VF=1.92V, (2.1V−1.92V)=0.18V;
4. 0.18V/2 mV=90° C.;
5. Total amount of heat: 90° C./(20 mA×1.92V)=2343°0 C./W;
6. In the normal temperature, as the temperature reduces 10 degree C., the illumination of LED increases 9%;
7. The concave cup of the present invention dissipate heat directly through the printed circuit board, and thus has a low contact heat resistance. Therefore, the advantages of a large transient large current, low heat dissipation, uniform illumination, high stability, low cost, mass production, etc. are achieved. Moreover, it can be done by workers themselves without needing to be performed externally.

A comparison of heat resistance about the concave cup type LED of the present invention and a LED of prior art are listed in the following:

| heat resistance | chip to supporter plus supporter to circuit board |
| --- | --- |
| general LED | 300° C./W + 145° C./W ≈ 445° C./W |
| HP type I | 155° C./W + 145° C./W ≈ 300° C./W |
| HP type II | 15° C./W + 145° C./W ≈ 160° C./W |
| concave cup LED | 0° C./W + 15° C./W ≈ 15° C./W |

The printed circuit board of the present invention can control the arc angle. The technology of concave cup has achieved an international standard through the proofs of experiences, practical use and production and the lift test.

In the prior art, a concave cup is formed by punching a punching pin to compress a printed circuit board. Because the grass fiber of a printed circuit board can not completely avoid elastic fatigue, and because a concave cup formed by a punching pin will formed concave cups of different depths and an unstable elasticity, the illumination is not uniform and thus a low yield ratio is induced. Moreover, a concave cup formed by punching a punching pin to compress a printed circuit board has a flat oblique surface at the periphery thereof instead of round wall to be a reflecting surface, thus, the concave cup has an incorrect light guiding angle. Furthermore, a concave cup formed by punching a punching pin to compress a printed circuit board has a confined size within a range of smaller than 3.0 mm. Thus, the light reflecting distance and reflecting angle can not be used correctly. Therefore, light can not be mixed uniformly. Therefore, it can not be steadily used to the whole manufacturing method of a product.

Therefore, many disadvantages in the prior art is necessary to be improved, and a novel product is desired.

SUMMARY OF THE INVENTION

The object of the present invention is to provide a manufacturing method of an LED of a type of round concave cup with a flat bottom. By a concave cup type printed circuit board of the present invention with properties of flatness, smoothness through plating, and good heat dissipation, light emitting dies can be fixed adhered to a concave cup type LED. Then it is point glued and baked so that the light emitted diode can be directly printed to a foil on the printed circuit board for dissipating heat rapidly. The flatness of the printed circuit board and the smoothness on the wall of the concave cup by plating serves for guiding a light forwards or reflecting a light beam. Moreover, the defects of wasting time and high cost in manufacturing an LED are improved. Furthermore, a damage due to separate from a tin furnace as plating printed circuit board is avoided.

Another object of the present invention is to provide a manufacturing method of an LED of a type of round concave cup with a flat bottom, wherein a die is directly adhered to a printed circuit board, and thus heat can be radiated rapidly.

A further object of the present invention is to provide a manufacturing method of an LED of a type of round concave cup with a flat bottom. The top round portion is packaged by glue, thus having a precise amplifying size for reflection and a unified amplifying ratio. The uniformity of light emitting can be achieved to a value within 1:11.

A yet object of the present invention is to provide a manufacturing method of an LED of a type of round concave cup with a flat bottom. Since dies of different colors can be implanted into the concave cup, the hue and illumination after mixing of lights can be improved greatly and a surface mounting device (SMD) can be manufactured.

A still object of the present invention is to provide a manufacturing method of an LED of a type of round concave cup with a flat bottom, which can be widely used in many applications, such as surface mounting light emitting diodes, point matrix light emitting diode products, seven sectional displaying light emitting diode products, LCD back light products, lights inner a car, braking lights, traffic lights, outdoor broadcast boards, etc.

The manufacturing method of an LED of a type of round concave cup with a flat bottom have two steps comprising:
The first stage is about a concave cup printed circuit board, in which a printed circuit board is placed in a CNC computer driller, and a special milling cutter is used to drill a concave cup with a found flat bottom at the speed of 12000 to 25000 rps (the depth of the cup must be set). After drilling process is complete, a sand ejector serves to polish the interior of the concave cup. Then, plating with copper ions (which is similar to the penetrating process of guide holes in a general printed circuit board), after plating nickel step and plating metal step are completed, the first stage is finished.

In the second stage, a manufacturing method of concave cup type LED is performed. The concave cup type LED in the first stage is processed through the steps of point gluing, fixing chip, baking, bonding, quality controlling, filling glue, baking again. Then a multiple usage concave cup type LED is fabricated.

BRIEF DESCRIPTION OF THE DRAWINGS

The drawings disclose an illustrative embodiment of the present invention which serves to exemplify the various advantages and objects hereof, and are as follows:

FIG. 7 is a schematic view of the light path f an unglued concave cup type LED;

FIG. 8 is a schematic view of the light path of a glued concave cup type LED.

DETAILED DESCRIPTION OF THE PREFERRED EMBODIMENT

Figure 1:
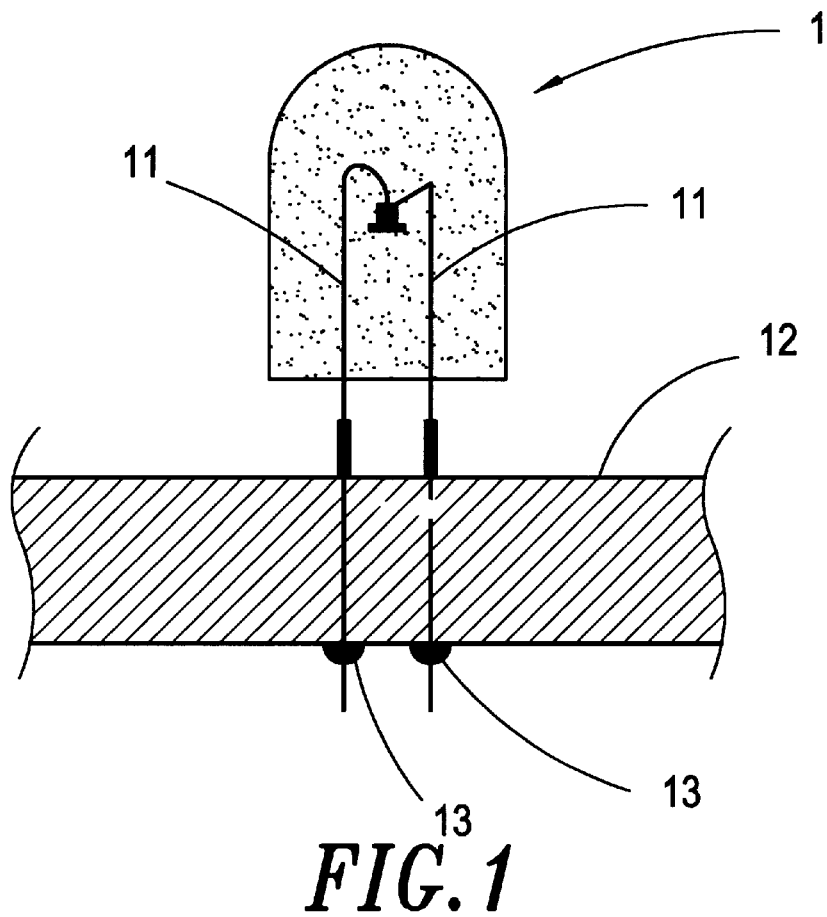
FIG. 1 is a schematic view of a prior art LED.
Figure 2:
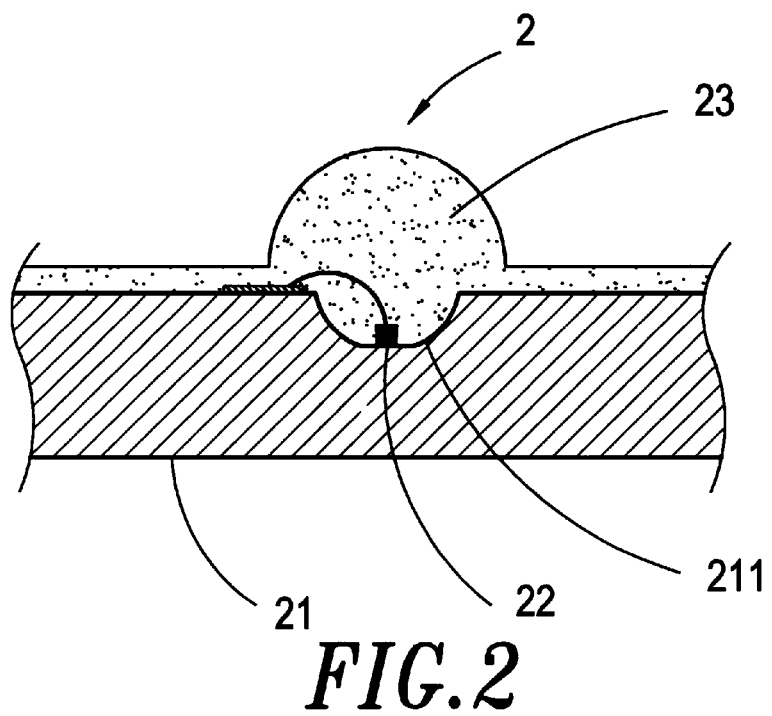
FIG. 2 is a schematic view of an concave cup type LED with a flat bottom.

With reference to FIG. 2, a schematic view for the manufacturing method of an LED of a type of round concave cup with a flat bottom is illustrated. It is appreciated from the figure that for the concave cup type LED of the present invention, firstly, by a CNC computer driller and a special milling cutter serve to drill a round concave cup with a flat bottom having an angle of R degrees under a speed of 12000 to 25000 rps. Then a die 22 is installed on the round concave cup with a flat bottom 211. Then, by a bonding technique, the die 22 on a round concave cup with a flat bottom 211 is interfaced with the foil on the printed circuit board 21. Finally, an epoxy resin glue 23 is packaged thereon. Thus, the advantages of a large transient large current, low heat dissipation, uniform illumination, high stability, low cost, mass production, etc. are achieved. Moreover, the present invention can be done by workers themselves without needing to be performed externally.

Figure 3:
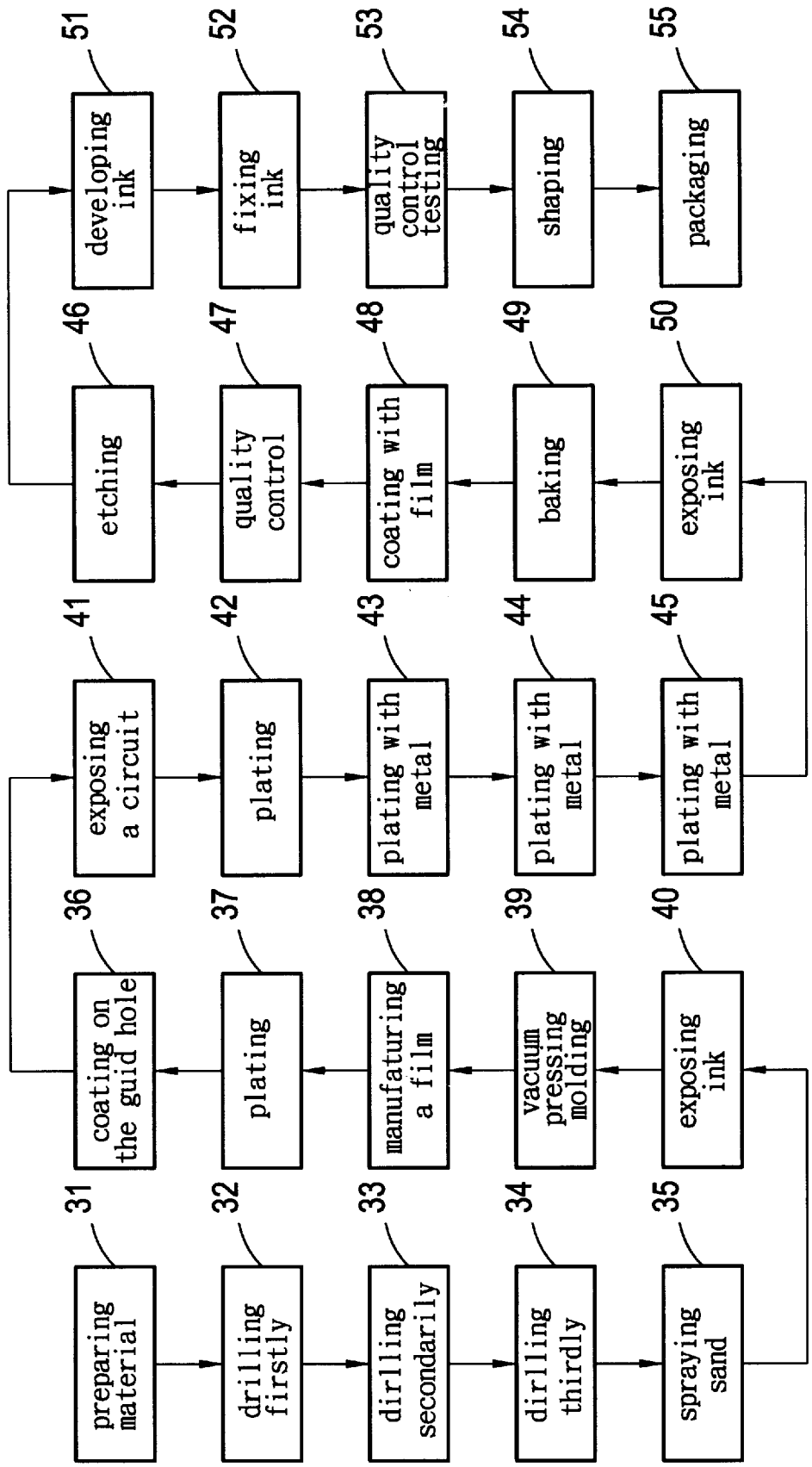
FIG. 3 shows a manufacturing process of a concave cup type printed circuit board with a flat bottom.

The manufacturing method of an LED of a type of round concave cup with a flat bottom according to the present invention has two stages. At first stage, referring to FIG. 3, a manufacturing process of the printed circuit board of round concave cup with a flat bottom is illustrated. The steps thereof is illustrated in the following.

Figure 4:
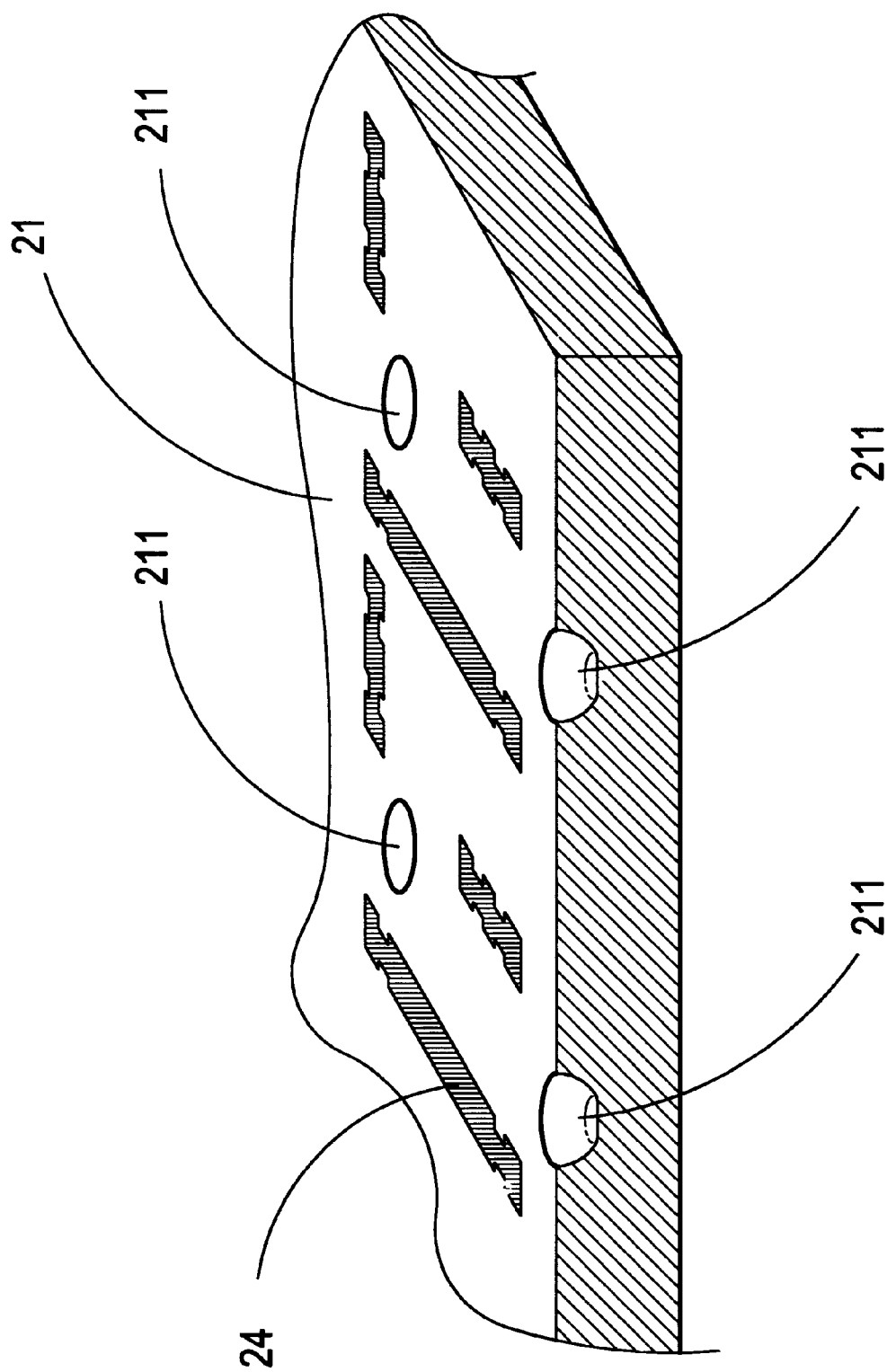
FIG. 4 shows a manufacturing process of a concave cup type printed circuit board with a flat bottom.

1. Preparing materials 31: the circuit board is FR5 FR4 CEM- 3 CEM-1 94V0, etc;
2. Drilling firstly: by a CNC driller to drill all guide holes;
3. Drilling secondarily 33: by a CNC driller, half drilling the position of the concave cup (the front guide hole is simply called as a blind hole);
4. Drilling thirdly 34: by a special milling cutter and a CNC driller, forming a concave cup;
5. Spraying sand 35: smoothing the bottom of the periphery of the printed circuit board concave cup;
6. Coating the guide holes, by a conductive agent (PHT);
7. Plating 37: plating with copper firstly;
8. Manufacturing a film 38: manufacturing a brown film;
9. Vacuum pressing molding 39: using dry wire ink (instead of wet wire ink)
10. exposing ink 40: exposing through an ultraviolet lamp tube of 5000 watts for 8–10 seconds;
11. Developing the circuit 41: developing by pure alkali, and then washing by pure water;
12. Plating 42: plating with copper secondarily;
13. Plating with metal 43: plating with soft nickel of 125U (for using in the LED fixing chip bonding);
14. Plating with metal 44: plating with metal of at least one or two U (electrolytic metal);
15. depriving of ink 45: depriving ink at etching portion by charged sodium (a purity of 95% for each piece of alkali);
16. Etching 46: etching the undesired portion by nitrogen chloride;
17. Quality controlling 47: modifying manually for shorting or opening circuits;
18. Coating with film 48: coating with welding-proof paint (Liguide) (in general, in the front and back surfaces);
19. Baking 49: baking the welding-proof ink;
20. Exposing the ink 50: exposing by ultraviolet light (UV light) of 7000 watts for 8–10 seconds;
21. Developing by ink 51: firstly developing by pure alkali and then washing by pure water;
22. Baking oil 52: baking in a temperature of 150 degrees for 60 minutes;
23. Quality control testing 53: ohm testing by a low current of 5 DCV/100M and a high current of 150 DCV/2M;
24. Shaping 54: shaping by a CNC milling cutter or by punching mold;
25. Packaging 55: packing by a vacuum packager;

By the aforesaid steps, a concave cup type printed circuit board is formed. Referring to FIG. 4, it is appreciated that the concave cup type printed circuit board 211 is formed with a plurality of concave cups 211 and foil 24. The number and sizes of the concave cups 211 are determined as desired.

The sizes and depths of the concave cups can be set as desired.

Size: 0.8 mm to 5 mm (which can not be achieved by a general support type LED lamp);

Depth: 0.8 mm to 0.5 mm (which can be achieved by a general supporting type LED lamp).

Figure 5:
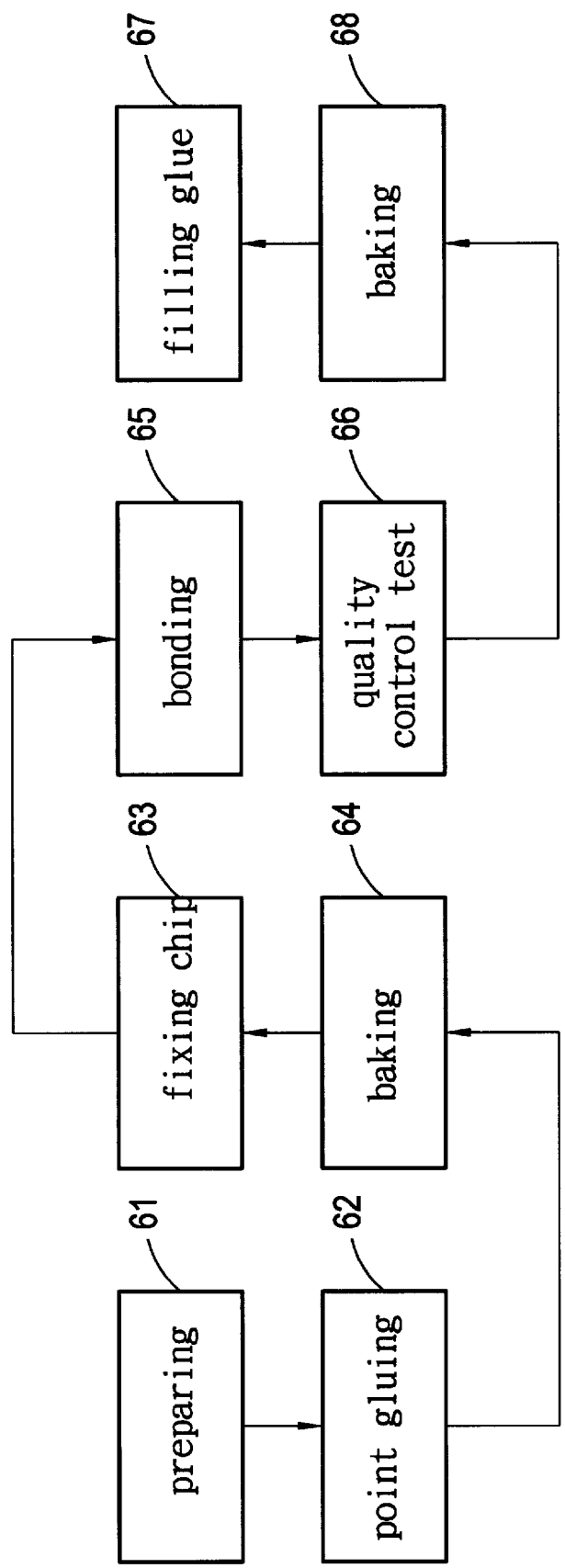
FIG. 5 shows a manufacturing process of a concave cup type LED.

After a concave type circuit board is complete, a process of second stage is performed. Shown in FIG. 5 is the flow diagram of the round concave cup type LED according to the present invention, which include the follow steps:

1. Preparing materials 61: LED dies with sizes of 9 mil to 14 mil;
2. point gluing 62: by an automatic point gluing machine for gluing sliver glue;
3. Fixing chip 63: by a computer automatic fixing chip machine to fixing positions of dies;

4. Baking 64: baking in a temperature of 150 degree for two hours so as to complete the fixing chip process;
5. Bonding 65: sintering positive electrodes and negative electrodes by an automatic bonding machine;
6. Quality control testing 66: performing a current impact test by a current of about 100 mA;
7. Filling glue 67: filing epoxy resin into a rubber particle and then placing into an LED;
8. Baking 68: baking at 120 degree C. for eight hours.

Figure 6:
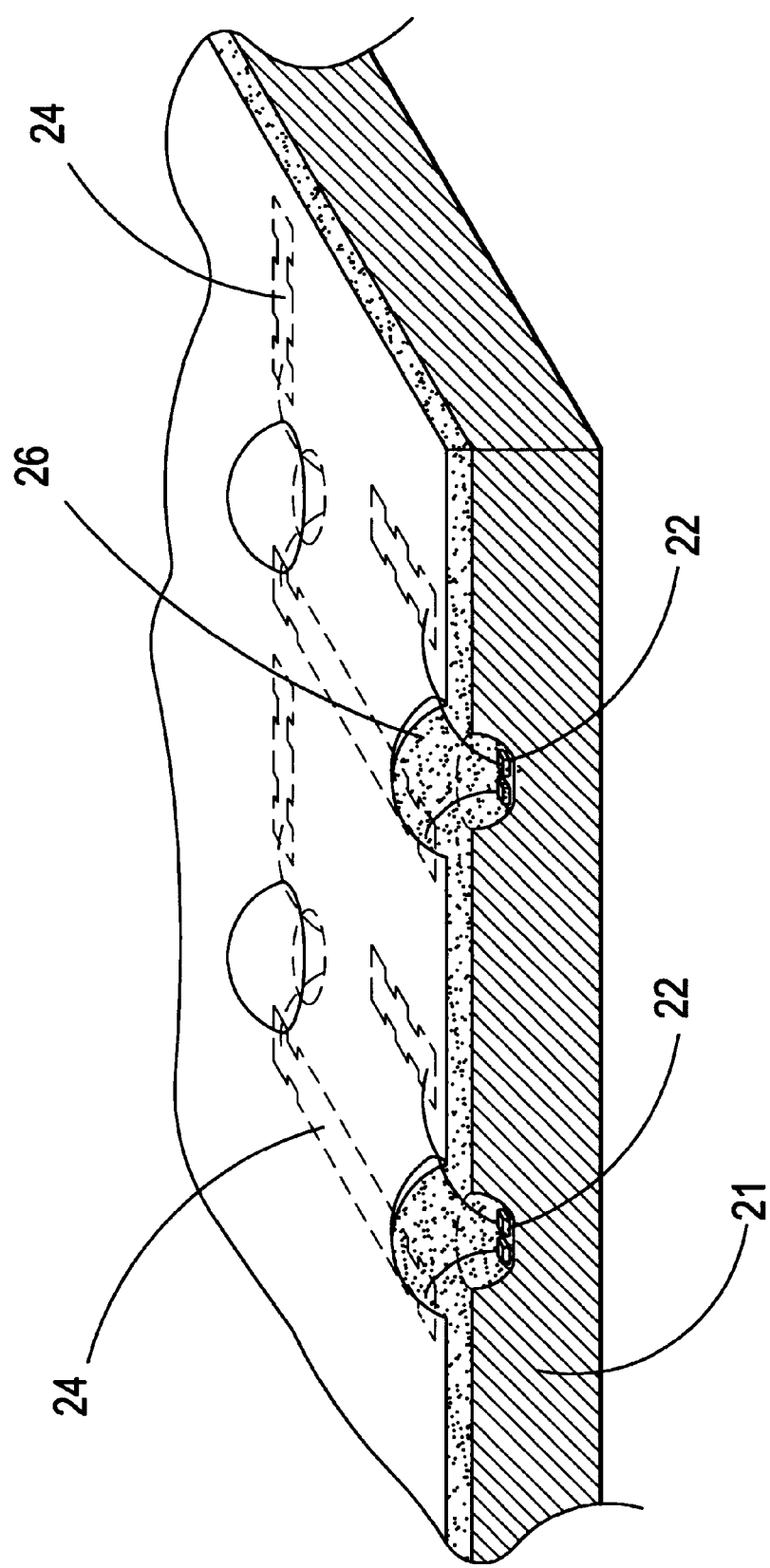
FIG. 6 shows a schematic view of a finished concave cup type LED.

The concave cup type LED manufactured by the aforesaid process is shown in FIG. 6. It is appreciated from the figure that for the finished concave cup type LED, a light emitting die is directly fixed to the concave cup type printed circuit board 21. Then by bonding technology, the positive electrodes and negative electrodes on the dies 22 are directly connected to the foil 24. Finally, an epoxy resin glue 23 is packaged.

With reference to FIG. 7, a schematic view of the concave cup type LED is illustrated. It is appreciated from the figure that as the epoxy resin glue is not packaged, the light from the die 22 will generate a forward convergent light path 7 due to the flatness of the cambered concave cup 211, smoothness of plating, and good heat dissipation.

With reference to FIG. 8, a schematic view of the concave cup type LED is illustrated. It is appreciated from the figure that after packaging by epoxy resin 23, the light path 7 generating by the light emitting dies 22 can be presented to the rubber particles uniformly.

The manufacturing method of an LED of a type of round concave cup with a flat bottom according to the present invention has the following advantages over the prior art:

1. Smoothness: the bottom and periphery of the concave cup present a round cambered bowel shape, the round wall forms as a smooth reflecting surface so as to reflect light completely and uniformly.
2. Heat Dissipation: The dies are directly buried into the concave cup type printed circuit board, and thus it has the advantage of good heat dissipation.
3. Illumination: The top round portion is packaged by glue, thus having a precise amplifying size for reflection and an unified amplifying ratio. The uniformity of light emitting can be achieved to a value within 1:11 which is better than 1:13 of prior art.
4. Light mixing: Since dies of different colors can be implanted into the concave cup, the hue and illumination after mixing of lights can be improved greatly and a surface mounting device (SMD) can be manufactured.
5. Economics: the manufacturing method can be simplified so as to have a lower cost and a better competence.

Many changes and modifications in the above described embodiment of the invention can, of course, be carried out without departing from the scope thereof. Accordingly, to promote the progress in science and the useful arts, the invention is disclosed and is intended to be limited only by the scope of the appended claims.

What is claimed is:

1. A manufacturing method of an LED of a type of round concave cup with a flat bottom comprising the steps of:
   (1) preparing materials: the material is a printed circuit board;
   (2) drilling firstly: by a CNC driller to drill all guide holes;
   (3) drilling secondarily: by a CNC driller, half drilling the position of the concave cup (the front guide hole is simply called as a blind hole);
   (4) drilling thirdly: by a special milling cutter and a CNC driller, forming a concave cup;
   (5) spraying sand: smoothing the bottom of the periphery of the printed circuit board concave cup;
   (6) Coating the guide holes, by a conductive agent on the guide hole;
   (7) plating: plating with copper firstly;
   (8) manufacturing a film: manufacturing a brown film;
   (9) vacuum pressing molding: using dry wire ink;
   (10) exposing ink: exposing through an ultraviolet lamp tube of 5000 watts for 8–10 seconds;
   (11) developing the circuit: developing by pure alkali, and then washing by pure water;
   (12) plating: plating with copper secondarily;
   (13) Plating with metal: plating with soft nickel (for using in the LED fixing chip bonding);
   (14) plating with metal: plating with metal of at least one or two U (electrolytic metal);
   (15) depriving of ink: depriving ink at etching portion by charged sodium;
   (16) etching: etching the undesired portion by nitrogen chloride;
   (17) quality controlling: modifying manually for shorting or opening circuits;
   (18) coating with film: coating with welding-proof paint (Liguide) (in general, in the front and back surfaces);
   (19) baking: baking the welding-proof ink;
   (20) exposing the ink: exposing by ultraviolet light (UV lamp);
   (21) developing by ink: firstly developing by pure alkali and then washing by pure water;
   (22) baking oil: baking in a temperature of 150 degrees for 60 minutes;
   (23) Quality control testing: testing by a low current and a high current;
   (24) shaping: shaping by a CNC milling cutter or by punching mold;
   (25) packaging: pacing by a vacuum packager;
   by aforesaid steps, a concave type circuit board being complete;
   (26) preparing materials: LED dies;
   (27) point gluing: by an automatic point gluing machine for gluing sliver glue;
   (28) fixing chip: by a computer automatic fixing chip machine to fixing positions of dies;
   (29) baking: baking to complete the fixing chip process;
   (30) bonding: sintering positive electrodes and negative electrodes by an automatic bonding machine;
   (31) quality control testing: performing a current impact test by a current;
   (32) filling glue: filling epoxy resin into a rubber particle and then placing into an LED;
   (33) baking: baking to complete the precess.

2. The manufacturing method of an LED of a type of round concave cup with a flat bottom as claimed in claim 1, wherein the printed circuit board is FR5, FR4, CEM-3, CEM-1, etc.

3. The manufacturing method of an LED of a type of round concave cup with a flat bottom as claimed in claim 1, wherein in step 10, the ink is exposing under an ultraviolet light of 5000 watts for 8–10 seconds.

4. The manufacturing method of an LED of a type of round concave cup with a flat bottom as claimed in claim 1, wherein in step 13, the plating metal is soft nickel of 125U.

5. The manufacturing method of an LED of a type of round concave cup with a flat bottom as claimed in claim 1, wherein in step 14, the plating metal is soft metal of 1–2U.

6. The manufacturing method of an LED of a type of round concave cup with a flat bottom as claimed in claim 1, wherein in step 15, the charged sodium for depriving ink has a purity of 95% for each piece of alkali.

7. The manufacturing method of an LED of a type of round concave cup with a flat bottom as claimed in claim 1, wherein in step 20 for exposing ink, an ultraviolet light of 7000 watts is used for 8–10 seconds.

8. The manufacturing method of an LED of a type of round concave cup with a flat bottom as claimed in claim 1, wherein in step 22 for fixing the ink, it is performed at a temperature of 150 degrees for 60 minutes.

9. The manufacturing method of an LED of a type of round concave cup with a flat bottom as claimed in claim 1, wherein in step 23 of quality control test, the large current for testing is 150 DCV/2M, while the small testing current is 5 DCV/100M.

10. The manufacturing method of an LED of a type of round concave cup with a flat bottom as claimed in claim 1, wherein in step 26, the LED die has a size of 9 mil to 14 mil.

11. The manufacturing method of an LED of a type of round concave cup with a flat bottom as claimed in claim 1, wherein in step 29, the die is fixed by baking under a temperature of 150 degrees for 2 hours.

12. The manufacturing method of an LED of a type of round concave cup with a flat bottom as claimed in claim 1, wherein in the step 31 for quality control test, it is performed by the current impact test of 100 mA.

13. The manufacturing method of an LED of a type of round concave cup with a flat bottom as claimed in claim 1, wherein in step 33, the baking operation is performed under a temperature of 120 degree C. and eight hours.

* * * * *